United States Patent [19]
Chiang et al.

[11] Patent Number: 5,856,234
[45] Date of Patent: *Jan. 5, 1999

[54] METHOD OF FABRICATING AN ANTIFUSE

[75] Inventors: Steve S. Chiang, Saratoga; Wenn-Jei Chen, Sunnyvale, both of Calif.

[73] Assignee: Actel Corporation, Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 501,596

[22] Filed: Jul. 11, 1995

Related U.S. Application Data

[63] Continuation of Ser. No. 121,594, Sep. 14, 1993, abandoned.

[51] Int. Cl.⁶ .................................................. H01L 21/70
[52] U.S. Cl. ........................... 438/600; 438/637; 438/791
[58] Field of Search .............................. 437/52, 195, 922, 437/978; 257/50, 530; 438/600, 131, 467, 770, 773, 791, 637

[56] References Cited

U.S. PATENT DOCUMENTS

| | | | |
|---|---|---|---|
| 4,282,648 | 8/1981 | Yu et al. | 29/571 |
| 4,404,581 | 9/1983 | Tam et al. | 357/59 |
| 4,561,409 | 12/1985 | Ellsworth et al. | 29/576 B |

(List continued on next page.)

FOREIGN PATENT DOCUMENTS

| | | |
|---|---|---|
| 0 414 361 | 2/1991 | European Pat. Off. . |
| 0 416 903 | 3/1991 | European Pat. Off. . |
| 0 452 091 | 10/1991 | European Pat. Off. . |
| 0 455 414 | 11/1991 | European Pat. Off. . |
| 0 500 034 | 8/1992 | European Pat. Off. . |
| 500034A1 | 8/1992 | European Pat. Off. ............... 257/530 |
| 0 501 120 | 9/1992 | European Pat. Off. . |
| 0 528 417 | 2/1993 | European Pat. Off. . |
| 0 539 197 | 4/1993 | European Pat. Off. . |
| 0 823 733 A2 | 2/1998 | European Pat. Off. . |
| 2 367 352 | 5/1978 | France . |

(List continued on next page.)

OTHER PUBLICATIONS

Wolf, et al., Silicon Processing, Lattice Press, 1986, pp. 57–58, 191–194, 198–219.
Wolf, et al., "Silicon Processing for the VLSI Era", Process Technology, vol. 1, 1996, pp. 57–58, 191–219.

*Primary Examiner*—T. N. Quach
*Attorney, Agent, or Firm*—D'Alessandro & Ritchie

[57] ABSTRACT

An antifuse fabrication process includes the steps of forming a lower antifuse electrode, forming an insulating layer over the lower antifuse electrode, forming an antifuse aperture in the insulating layer, forming a dielectric antifuse material including a first layer comprising silicon dioxide and a second layer comprising silicon nitride over the antifuse insulating layer, etching the silicon nitride layer to form a small layer of silicon nitride in a region centered over the antifuse aperture, optionally forming a third dielectric antifuse layer comprising silicon dioxide, and forming an upper antifuse electrode. Alternatively, the first, second, and third layers of dielectric antifuse material may be formed and then etched to form a small composite sandwich structure of silicon nitride and silicon dioxide over the first silicon dioxide layer in a region centered over the antifuse aperture prior to forming an upper antifuse electrode.

15 Claims, 3 Drawing Sheets

U.S. PATENT DOCUMENTS

| | | | |
|---|---|---|---|
| 4,651,409 | 3/1987 | Ellsworth et al. | 29/576 |
| 4,748,490 | 5/1988 | Hollingsworth | 357/51 |
| 4,751,197 | 6/1988 | Wills | 437/174 |
| 4,796,075 | 1/1989 | Whitten | 357/51 |
| 4,822,753 | 4/1989 | Pintchovski et al. | 437/192 |
| 4,823,181 | 4/1989 | Mohsen et al. | 257/530 |
| 4,847,732 | 7/1989 | Stopper et al. | 361/395 |
| 4,870,302 | 9/1989 | Freeman | 307/465 |
| 4,876,220 | 10/1989 | Mohsen et al. | 437/170 |
| 4,899,205 | 2/1990 | Hamdy et al. | 357/51 |
| 4,912,066 | 3/1990 | Wills | 437/173 |
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 257/530 |
| 5,087,589 | 2/1992 | Chapman et al. | 437/195 |
| 5,087,958 | 2/1992 | Chen et al. | 257/530 |
| 5,093,711 | 3/1992 | Hirakawa | 357/71 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,181,096 | 1/1993 | Forouhi | 257/530 |
| 5,191,550 | 3/1993 | Kubota | 365/96 |
| 5,194,759 | 3/1993 | El-Ayat et al. | 307/202.1 |
| 5,196,724 | 3/1993 | Gordon et al. | 257/530 |
| 5,219,982 | 6/1993 | Buijsingh et al. | 528/392 |
| 5,233,206 | 8/1993 | Lee et al. | 257/50 |
| 5,233,217 | 8/1993 | Dixit et al. | 257/530 |
| 5,241,496 | 8/1993 | Lowrey et al. | 365/96 |
| 5,242,851 | 9/1993 | Choi | 437/49 |
| 5,248,632 | 9/1993 | Tung et al. | 437/195 |
| 5,250,459 | 10/1993 | Lee | 437/52 |
| 5,266,829 | 11/1993 | Hamdy et al. | 257/530 |
| 5,270,251 | 12/1993 | Cohen | 437/173 |
| 5,272,101 | 12/1993 | Forouhi et al. | 437/50 |
| 5,272,666 | 12/1993 | Tsang et al. | 365/96 |
| 5,284,788 | 2/1994 | Spratt et al. | 437/52 |
| 5,286,993 | 2/1994 | Lowrey et al. | 257/390 |
| 5,290,734 | 3/1994 | Boardman et al. | 437/195 |
| 5,293,133 | 3/1994 | Birkner et al. | 324/713 |
| 5,298,784 | 3/1994 | Gambino et al. | 257/529 |
| 5,300,456 | 4/1994 | Tigelaar et al. | 437/195 |
| 5,302,546 | 4/1994 | Gordon et al. | 437/170 |
| 5,308,795 | 5/1994 | Hawley et al. | 437/195 |
| 5,322,812 | 6/1994 | Dixit et al. | 437/60 |
| 5,327,024 | 7/1994 | Cox | 307/465 |
| 5,328,865 | 7/1994 | Boardman et al. | 437/60 |
| 5,329,153 | 7/1994 | Dixit | 257/530 |
| 5,341,267 | 8/1994 | Whitten et al. | 361/56 |
| 5,353,246 | 10/1994 | Tsang et al. | 365/96 |
| 5,404,029 | 4/1995 | Husher et al. | 257/50 |
| 5,412,593 | 5/1995 | Magel et al. | 365/96 |
| 5,705,849 | 1/1998 | Zheng et al. | 257/530 |
| 5,723,358 | 3/1998 | Manley | 437/60 |
| 5,726,484 | 3/1998 | Hart et al. | 257/530 |
| 5,753,528 | 5/1998 | Forouhi et al. | 437/60 |
| 5,763,299 | 6/1998 | McCollum et al. | 438/131 |

FOREIGN PATENT DOCUMENTS

| | | |
|---|---|---|
| 0455414 | 4/1991 | France . |
| 08-316322 | 11/1996 | Japan . |
| 08-316324 | 11/1996 | Japan . |
| 08-330430 | 12/1996 | Japan . |
| 09-27548 | 1/1997 | Japan . |
| 09-36236 | 2/1997 | Japan . |
| 09-505445 | 5/1997 | Japan . |
| 2 222 024 | 2/1990 | United Kingdom . |
| WO87/00969 | 7/1986 | WIPO . |
| WO87/02827 | 10/1986 | WIPO . |
| WO87/00969 | 2/1987 | WIPO . |
| WO87/02827 | 5/1987 | WIPO . |
| WO92/13359 | 1/1992 | WIPO . |
| WO92/20109 | 4/1992 | WIPO . |
| WO92/13359 | 8/1992 | WIPO . |
| WO92/20109 | 11/1992 | WIPO . |
| WO93/03499 | 2/1993 | WIPO . |
| WO93/04499 | 3/1993 | WIPO . |
| WO93/05514 | 3/1993 | WIPO . |

METHOD OF FABRICATING AN ANTIFUSE

CROSS-REFERENCE TO RELATED APPLICATION

This is a continuation of patent application Ser. No. 08/121,594 filed Sep. 14, 1993, abandoned.

BACKGROUND OF THE INVENTION

1. Field of the Invention

The present invention relates to semiconductor fabrication processes. More particularly, the present invention relates to methods for fabricating antifuse devices as a part of a CMOS integrated circuit fabrication process.

2. The Prior Art

Numerous processes for fabrication of antifuses are known in the prior art. Some of these processes may be easily integrated into already existing integrated circuit fabrication processes. Some antifuse elements incorporate a dielectric antifuse material which contains a nitride such as silicon nitride, either as a single layer, or as a part of a multilayer dielectric such as that described in U.S. Pat. Nos. 4,823,181 and 4,899,205. Such structures exhibit excellent leakage and reliability characteristics, and are thus preferred for certain applications.

Major thermal cycles associated with an antifuse fabrication process include oxidation of silicon nitride, drive in of arsenic dopant into polysilicon and oxidation of the polysilicon. While these thermal cycles are necessary for antifuse fabrication, they adversely impact the performance of transistors which are fabricated on the same integrated circuit as the antifuse. Such transistors include CMOS low voltage and high voltage active transistors, and in particular, field isolation transistors which separate the antifuses from each other.

The problem with the field transistor next to the antifuse is that when the thermal cycle is too long, this field transistor will become leaky. The degradation is introduced during antifuse processing, when an oxide-nitride-oxide antifuse material layer is formed not just in the antifuse region but also on top of the field oxide. After deposition and etching of polysilicon gate oxide, this nitride layer remains in the field oxide region under the polysilicon and becomes part of the field isolation transistor. Thermal cycle processes after nitride is formed will move nitrogen from the ONO nitride layer on top of the field oxide to the oxide/silicon interface. This creates positive traps, lowers the field transistor threshold, increases field transistor leakage, and eventually leads to poor isolation performance. As a result, during antifuse programming, this leakage will cause the antifuse adjacent to the desired antifuse to become programmed thus creating accidentally programmed antifuses. During normal operation, this leakage will contribute to the increase in standby leakage current.

In advanced CMOS or sub micron CMOS processes where the thermal budget after CMOS transistors are formed is very small, the long thermal budget associated with fabrication of the antifuses makes it unattractive for the antifuses to be processed after the CMOS transistors. One way to solve this problem from process viewpoint is to place the antifuse fabrication process before the transistor fabrication process. This eliminates exposing the transistors to the antifuse fabrication thermal cycles. However, the field isolation transistors which separate the antifuses from each other still suffer from the long thermal cycles and the added degradation associated with the thermal cycles. This happens because the top electrode of the antifuse forms the gate of the field transistors.

Circuits which help to alleviate this field isolation transistor problem are disclosed in U.S. Pat. No. 5,130,777. These circuits require additional layout area on the integrated circuit die. Sometimes the addition of these circuits adversely affects the flexibility of the antifuse programming algorithm and limits the optimization of the antifuse performance. Each thermal cycle is important. Therefore, the field transistor leakage should be reduced with processing step considerations. While it is necessary to reduce thermal cycles, it has to be kept in mind that oxide thickness on top of the nitride layer is very important in preventing antifuse leakage and improving antifuse manufacturing margin, especially in a plasma processing environment. In addition, the drive-in cycle for the arsenic dopant into the polysilicon is also important to ensure that arsenic is present close to the ONO interface to create a low resistance programmed antifuse.

The present invention is intended to solve this field isolation transistor problem from a process viewpoint. In addition, considerations are made to assure manufacturability and reliability of the antifuse. The present invention provides methods for forming antifuses which can maintain antifuse reliability while minimizing effects of antifuse process on field transistor performance.

BRIEF DESCRIPTION OF THE INVENTION

According to a first embodiment of the present invention, an antifuse fabrication process includes the steps of forming a plurality of lower antifuse electrodes separated from one another by field oxide regions, forming an insulating layer over the lower antifuse electrodes, forming antifuse apertures in the insulating layer to expose the lower antifuse electrodes, forming a dielectric antifuse material including a first layer comprising silicon dioxide and a second layer comprising silicon nitride over the antifuse insulating layer, etching the silicon nitride layer to form a small layer of silicon nitride in regions centered over the antifuse apertures, optionally forming a third dielectric antifuse layer comprising silicon dioxide, and forming upper antifuse electrodes. Conventional back-end processing steps may then be performed to complete the integrated circuit structure. By etching the silicon nitride layer away in the field oxide area, the trap sources are removed from the field area. Subsequent thermal cycles will not produce adverse effects on field transistor performance.

According to a second aspect of the present invention, an antifuse fabrication process includes the steps of forming a plurality of lower antifuse electrodes, separated from one another by field oxide regions, forming an insulating layer over the lower antifuse electrodes, forming antifuse apertures in the insulating layer, forming a dielectric antifuse material including a first layer comprising silicon dioxide, a second layer comprising silicon nitride, and a third layer comprising silicon dioxide over the antifuse insulating layer, etching the third silicon dioxide layer and the second silicon nitride layer to form a small composite sandwich structure of silicon nitride and silicon dioxide over the first silicon dioxide layer in regions centered over the antifuse apertures, and forming upper antifuse electrodes. Conventional back-end processing steps may then be performed to complete the integrated circuit structure. By removing the nitride from the field isolation regions after both the nitride and the top layer of silicon dioxide for the antifuse material layer are formed, the possibility of wet chemicals (used during resist definition and removal and definition of nitride and top oxide layers) coming directly in contact with the nitride layer and possibly causing undesirable side effects is eliminated.

According to a third aspect of the present invention, an antifuse fabrication process includes the steps of forming a plurality of lower antifuse electrodes, separated from one another by field oxide regions, forming an insulating layer over the lower antifuse electrodes, forming antifuse apertures in the insulating layer, forming a dielectric antifuse material including a first layer comprising silicon dioxide, a second layer comprising silicon nitride, and a third layer comprising silicon dioxide over the antifuse insulating layer, forming a thin layer of doped or undoped polysilicon (a portion of the upper electrodes) over the top layer of the antifuse material, etching away the thin polysilicon layer, the third silicon dioxide layer and the second silicon nitride layer to form a small composite sandwich structure of polysilicon, silicon dioxide, silicon nitride and silicon dioxide over the first silicon dioxide layer in regions centered over the antifuse apertures, forming the remaining thickness of the upper antifuse electrodes, and doping the upper electrodes. Conventional back-end processing steps may then be performed to complete the integrated circuit structure. This method prevents any chemicals from coming into contact with the antifuse material layers. In addition, since polysilicon doping is performed at high temperatures, the fact that the thermal cycle of that process does not take place until after the second poly formation step, will not affect field transistor performance since the nitride layer has already been removed.

The step of forming the top silicon dioxide layer of an oxide/nitride/oxide dielectric antifuse material layer may be performed as a combination wet/dry oxidation step. The wet cycle significantly reduces the oxidation time. Alternatively, the top silicon dioxide layer can be formed as a low-temperature CVD oxide, or may be formed by rapid thermal oxidation, resulting in shorter thermal cycle effects compared with the traditional oxidation furnace thermal cycle. A re-ox cycle used to cap the thin polysilicon layer may be formed using a wet, rather than a dry oxidation process. Not only does this reduce the thermal cycle, but the wet cycle also serves as a gettering step for removing excess nitrogen residue from the field transistor areas.

According to the present invention, the nitride layer comprises $Si_xN_y$. In order to minimize field transistor leakage, the x/y ratio is preferred to be above 0.75. In order to accomplish this, the gas ratio R of $NH_3$ and $SiH_2Cl_2, SiH_4$, or $SiCl_4$ is chosen to be preferably between 1:1 and 20:1. The higher the ratio R, the more nitrogen rich the nitride will be, thus assuring high ONO quality. However, the extra nitrogen creates more traps and increases the field transistor leakage. If the ratio R is too small, field transistor leakage will be reduced but at the expense of degraded ONO quality.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
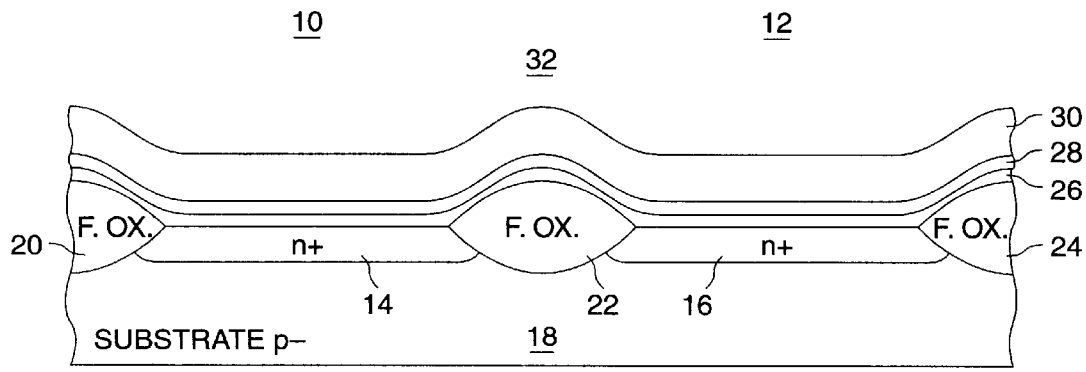
FIG. 1 is a cross sectional view of a typical antifuse employing a silicon nitride layer in a multi-layer dielectric antifuse layer between two antifuse electrodes.

Referring first to FIG. 1, a pair of typical prior art antifuse structures employing a nitride layer in a dielectric antifuse layer are shown in cross section. Antifuses 10 and 12 include lower antifuse electrodes 14 and 16, respectively, shown as n+ diffused regions in a p-type semiconductor substrate 18. Antifuses 10 and 12 are separated from one another and from other adjacent antifuses by typical field oxide regions 20, 22, and 24. Those of ordinary skill in the art will recognize that antifuses 10 and 12 could also be located in layers above the surface of semiconductor substrate 18, in which case lower antifuse electrodes 14 and 16 could comprise, for example, a doped polysilicon layer or a metal interconnect layer. Examples of such antifuse structures are disclosed and claimed in U.S. Pat. Nos. 4,823,181 and 4,899,205.

In the particular embodiment of a prior art antifuse structure shown in FIG. 1, a multilayer dielectric antifuse layer is formed over the lower antifuse electrodes 14 and 16 and includes a lower silicon dioxide layer 26 and an upper silicon nitride layer 28. An upper antifuse electrode 30 comprises a layer of arsenic doped polysilicon, as is known in the art. As disclosed in prior U.S. Pat. Nos. 4,823,181 and 4,899,205, a third silicon dioxide layer (not shown) may be formed over silicon nitride layer 28 prior to the formation of upper antifuse electrode 30. Those of ordinary skill in the art will understand that the structure shown in FIG. 1 may be somewhat varied. For example, an initial interlayer dielectric layer may be provided over the surface of the substrate 18 and the multilayer dielectric antifuse material may be formed into antifuse apertures etched in the interlayer dielectric, or the antifuse layers may first be formed, followed by formation of the interlayer dielectric and antifuse apertures, into which the upper antifuse electrode 30 may be formed.

Those of ordinary skill in the art will recognize that the field oxide regions. form part of the structure of field transistors in the integrated circuit containing the antifuses 10 and 12. For example, a field transistor 32 includes a pair of spaced apart source/drain regions 14 and 16 disposed in substrate 18, and a gate formed by the portion of polysilicon layer 30 lying between regions 14 and 16 over a gate dielectric comprised of antifuse material layers 26 and 28.

When either of the prior art antifuse structures 10 or 12 remains unprogrammed in a circuit in which it is employed, it exhibits a capacitance dependent on the area of lower antifuse electrode 14 or 16, upper antifuse electrode 30, and the thickness and dielectric constant of the antifuse layer comprising silicon dioxide layer 26 and silicon nitride layer 28. However, those of ordinary skill in the art will recognize that an additional component of the capacitance of antifuses 10 and 12 in their unprogrammed state includes a capacitance component contributed by the charge trapping phenomenon associated with the existence of the silicon nitride layer 28 under the polysilicon upper electrode 30. This additional incremental capacitance is undesirable because it tends to degrade the switching speeds of the circuits containing the antifuses. By removing the nitride layer, the subsequent oxidation step performed prior to the gate polysilicon step will increase the total oxide thickness substantially and will further reduce the capacitance.

In addition, such skilled persons will appreciate from this disclosure that charge trapped inside the nitride layer 28 in the field transistor 32 will shift the threshold voltage of the device, thus creating a leakage current path during programming or device operation between the lower electrodes 14 and 16 of adjacent antifuses 10 and 12, since the regions 14 and 16 serve as the source/drain diffusions of the field transistor 32. It is to the solution of these prior art problems that the present invention is directed.

According to the present invention, the component of capacitance and field transistor leakage caused by nitride layer charge trapping is reduced by confining the area of the silicon nitride layer to the region of the antifuse aperture. There are several embodiments of the invention. For an ease of understanding the present invention, structures in the following drawing figures which correspond to structures identified in FIG. 1 will be called out using the same reference numerals assigned to corresponding structures in FIG. 1.

Figure 2A:
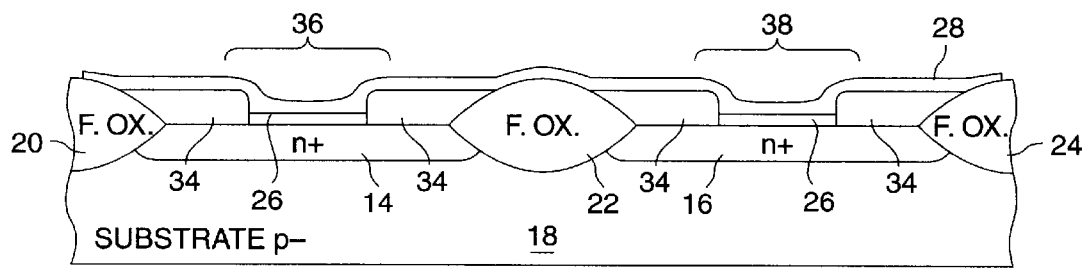
FIGS. 2a–2c are cross sectional views of first embodiment of an antifuse employing a silicon nitride layer in a dielectric antifuse layer between two antifuse electrodes, shown at the completion of selected steps in the fabrication process to illustrate the present invention.
Figure 2B:
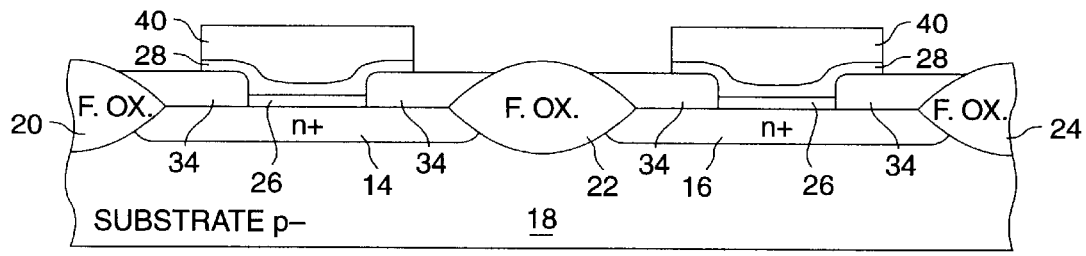
Figure 2C:
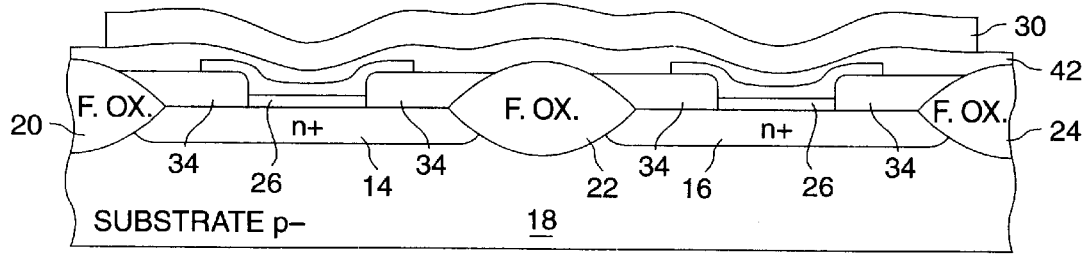

Referring now to FIGS. 2a–2c, cross sectional views of an illustrative antifuse structure fabricated within a CMOS fabrication process according to the present invention are shown following completion of selected steps in the fabrication process to illustrate the first embodiment of the present invention.

FIG. 2a shows a pair of antifuse structures 10 and 12 fabricated in a semiconductor substrate 18 and separated by a conventional field oxide region 22. The cross section of FIG. 2a is taken following formation of a pair of lower antifuse electrodes 14 and 16 each comprising an n+ doped region. Additional conventional field oxide regions 20 and 24 are employed to separate antifuses 10 and 12 from other adjacent antifuses or other structures disposed in substrate 18. A dielectric layer 34 is formed over the surface of the substrate 18 above lower antifuse electrodes 14 and 16 using known semiconductor processing techniques, and antifuse apertures 36 and 38 are formed in the insulating layer 34 using known photolithographic and etching methods.

A first antifuse dielectric layer 26 comprising silicon dioxide is then formed using known techniques, followed by formation of a second antifuse dielectric layer 28 comprising silicon nitride layer using known techniques. FIG. 2a shows the structure resulting after all these process steps have been performed.

At this point in a conventional prior art antifuse fabrication process, either a third antifuse dielectric layer comprising silicon dioxide or other known materials, or upper antifuse electrode 30 would be formed over the surface of second antifuse dielectric layer 28. According to the present invention, however, and as may be seen from an examination of FIG. 2b, a masking layer 40 is placed over the surface of second antifuse dielectric layer 28 to define two nitride regions, one centered over antifuse aperture 36 and one centered over antifuse aperture 38. Masking layer 40 may be a conventional photomask as known in the art and is used as an etch mask for second antifuse dielectric layer 28. The nitride dielectric layer 28 is then etched away in the mask openings using conventional semiconductor processing techniques. The structure resulting after the performance of these steps is shown in FIG. 2b.

Those of ordinary skill in the art will recognize that the embodiment shown in FIGS. 2a–2c is merely illustrative of the concepts of the invention, and the selection of two antifuses to illustrate the invention is not to be considered as limiting. Such skilled persons will realize that the number of antifuses employed in a semiconductor structure fabricated in accordance with the principles of the present invention will be solely a matter of design choice.

This etching step has the effect of reducing the area of the silicon nitride layer comprising second antifuse dielectric layer 28, confining it to the regions where antifuses 10 and 12 are formed. This step thus reduces the potential nitride charge trapping contribution to the capacitance of the antifuse, should it remain unprogrammed in the final circuit. In addition, the removal of the nitride from the region of the field transistor 32 prevents the threshold shifting effects which would otherwise result in leakage currents between the doped regions 14 and 16 forming the lower electrodes of antifuses 10 and 12.

Referring now to FIG. 2c, after the masking layer 40 has been removed, a third antifuse dielectric layer 42, preferably comprising silicon dioxide, may be formed using conventional methods. Since the nitride is removed in regions outside of the cell opening, the oxidation step will increase the total oxide thickness in these regions, and further reduce the capacitance. Upper antifuse electrode 30 is then formed and defined using conventional processing techniques. FIG. 2c shows the structure resulting after the performance of these steps has been completed. The antifuse structure is now complete, and other conventional process steps may be performed to complete the circuit structure.

Those of ordinary skill in the art will recognize that the embodiment of in FIGS. 2a–2c is merely illustrative and that antifuse of the present invention could be fabricated in layers above and insulated from the semiconductor substrate 14. The minimization of charge trapping capacitance according to this aspect of the present invention is not limited to antifuse structures including a diffused substrate region as the lower antifuse electrode. In addition, those of ordinary skill in the art will realize that the principles of the present invention may be applied to other dielectric layer combinations, such as nitride/oxide or nitride/oxide/nitride by performing etching steps to confine the nitride regions to the areas in and immediately adjacent to the antifuse apertures 36 and 38. Such structures and processes are intended to fall within the scope of the present invention.

A second embodiment of the present invention is illustrated with reference to FIGS. 3a–3c, cross sectional views of the integrated circuit structure resulting after performance of selected steps in an antifuse fabrication process integrated into a CMOS fabrication process according to an alternate embodiment of the present invention.

Figure 3A:
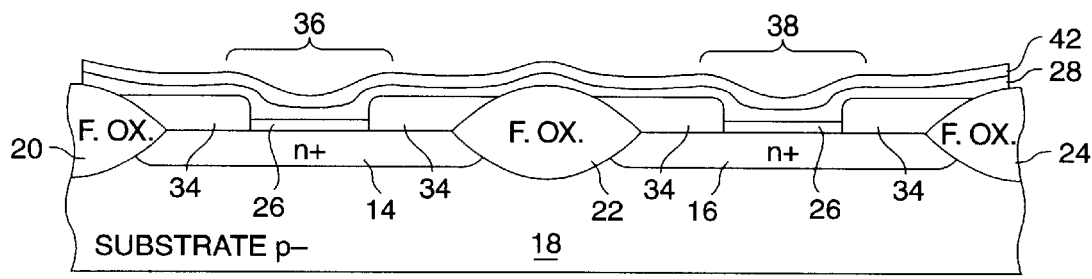
FIGS. 3a–3c are cross sectional views of a second embodiment of an antifuse employing a silicon nitride layer in a dielectric antifuse layer between two antifuse electrodes, shown at the completion of selected steps in the fabrication process to illustrate the present invention.

A pair of antifuse structures are shown in FIG. 3a disposed within a semiconductor substrate 18 following formation of lower antifuse electrodes 14 and 16, each comprising an n+ doped region formed between conventional field oxide regions (20, 22, and 24) by known fabrication techniques. A dielectric layer 34 is formed over the surface of the substrate 18 above lower antifuse electrodes 14 and 16 using known semiconductor processing techniques, and a pair of antifuse apertures 36 and 38 are formed in the insulating layer 34 using known photolithographic and etching methods.

A first antifuse dielectric layer 26 comprising silicon dioxide is then formed using known techniques, followed by formation of a second antifuse dielectric layer 28 comprising silicon nitride layer using known techniques. At this point in the process, the steps performed are identical to the steps performed according to the first embodiment of the invention, as shown in FIG. 2a.

The second embodiment of the present invention differs from the first embodiment in that the third antifuse layer 42 comprising silicon dioxide is next formed on top of the second antifuse dielectric layer. FIG. 3a shows the structure resulting after these layers have been formed.

Figure 3B:
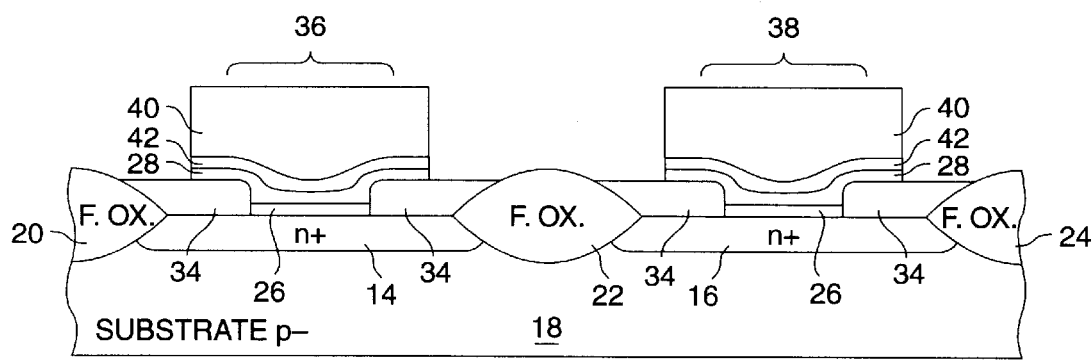
Figure 3C:
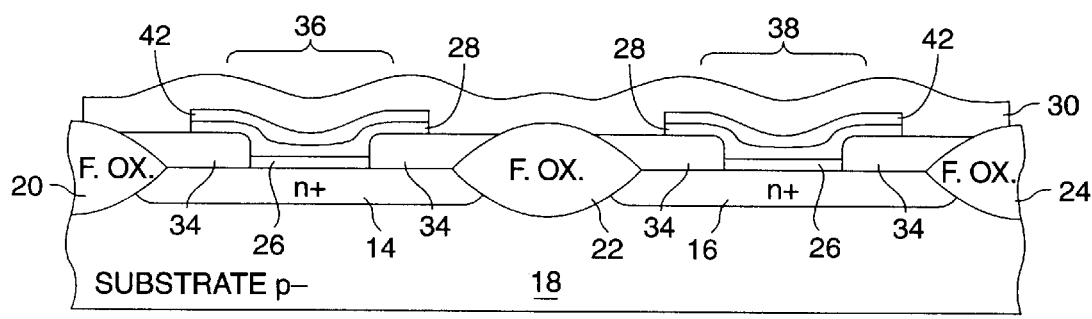

Referring now to FIG. 3b, a masking layer 40 is placed over the surface of third antifuse dielectric layer 42 to define two regions, one centered over antifuse aperture 36 and one centered over antifuse aperture 38. As in the first embodiment of the present invention, masking layer 40 is used as an etch mask, but in this embodiment of the invention, the entire three-layer antifuse dielectric stack is formed and then masked for etching. The antifuse dielectric stack is then etched using conventional semiconductor processing techniques. The structure resulting after the performance of these steps is shown in FIG. 3b.

As in the first embodiment of the invention disclosed herein, this etching step has the effect of reducing the area of the silicon nitride layer comprising second antifuse dielectric layer 28 and thus reduces the potential nitride charge trapping contribution to the capacitance of the antifuse, should it remain unprogrammed in the final circuit. In addition, the threshold shifting of the field transistor is eliminated, thus reducing any potential leakage currents. The advantage of this approach over the previous approach is that the masking layer does not touch the nitride layer. Thus, the wet chemicals used during the masking layer removal step will not come into contact with the nitride layer, improving the quality of the finished antifuse.

After the masking layer 40 has been removed, upper antifuse electrode 30 is then formed and defined using conventional techniques. FIG. 3c shows the structure resulting after the performance of these steps has been completed. The antifuse structure is now complete, and other conventional process steps may be performed to complete the circuit structure.

A third embodiment of the present invention is illustrated with reference to FIGS. 4a–4c, cross sectional views of the integrated circuit structure resulting after performance of selected steps in an antifuse fabrication process integrated into a CMOS fabrication process according to an alternate embodiment of the present invention.

Figure 4A:
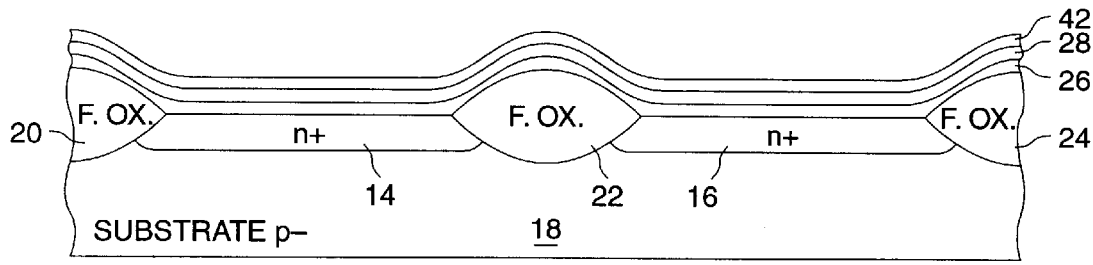
FIGS. 4a–4d are cross sectional views of a third embodiment of an antifuse employing a silicon nitride layer in a dielectric antifuse layer between two antifuse electrodes, shown at the completion of selected steps in the fabrication process to illustrate the present invention.
Figure 4B:
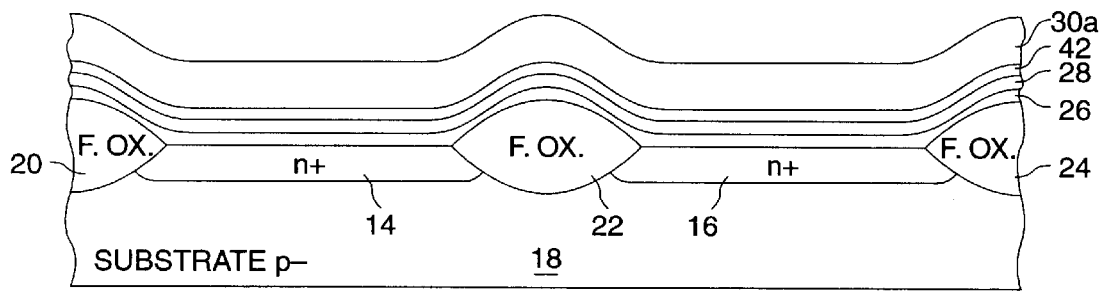

A pair of antifuse structures are shown in FIG. 4a disposed within a semiconductor substrate 18 following formation of lower antifuse electrodes 14 and 16, each comprising an n+ doped region formed between conventional field oxide regions (20, 22, and 24) by known fabrication techniques. A dielectric layer 34 is formed over the surface of the substrate 18 above lower antifuse electrodes 14 and 16 using known semiconductor processing techniques, and a pair of antifuse apertures 36 and 38 are formed in the insulating layer 34 using known photolithographic and etching methods.

A first antifuse dielectric layer 26 comprising silicon dioxide is then formed using known techniques, followed by formation of a second antifuse dielectric layer 28 comprising silicon nitride layer using known techniques. A third antifuse layer 42 comprising silicon dioxide is then formed on top of the second antifuse dielectric layer. FIG. 4a shows the structure resulting after these layers have been formed. At this point in the process, the steps which have been performed are identical to the steps performed according to the second embodiment of the invention, as shown in FIG. 3a.

This embodiment of the present invention differs from the second embodiment in that, instead of the masking and etching step taking place at this point in the process, a thin first layer 30a (i.e., between about 110 to about 2,000 angstroms thick) of the upper antifuse electrode 30 is now formed over the top of the third antifuse dielectric layer 42. FIG. 4b shows the structure resulting after formation of the thin first layer of upper antifuse electrode 30.

Figure 4C:
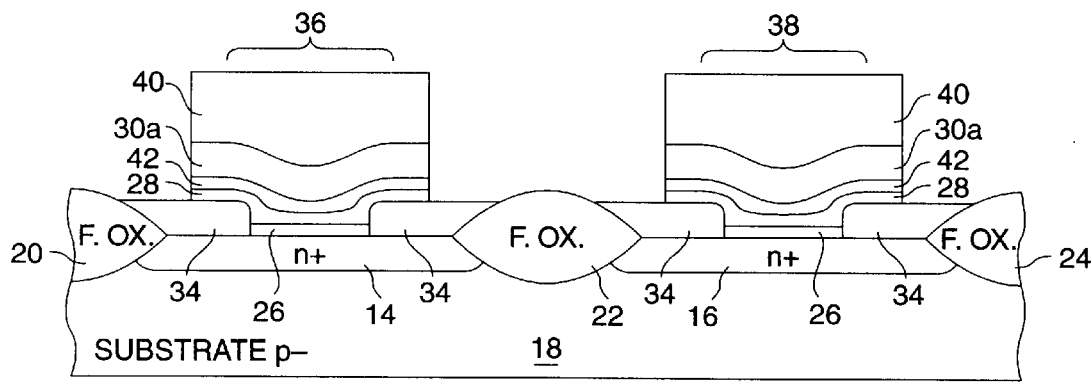
Figure 4D:
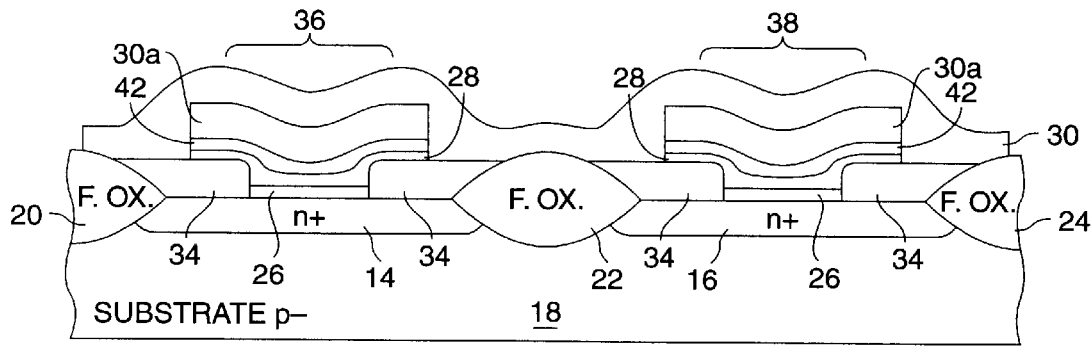

Referring now to FIG. 4c, a masking layer 40 is placed over the surface of the thin first layer 30a of upper electrode 30 to define two regions, one centered over antifusd aperture 36 and one centered over antifuse aperture 38. As in the first and second embodiments of the present invention, masking layer 40 is used as an etch mask, but in this embodiment of the invention, the entire three-layer antifuse dielectric stack plus thin first layer 30a of upper electrode 30 are first formed and then masked for etching. The antifuse dielectric stack is then etched using conventional semiconductor processing techniques. The structure resulting after the performance of these steps is shown in FIG. 4c. The masking layer 40 has been removed and the remaining portion of upper antifuse electrode 30 is then formed and defined using conventional techniques. The antifuse structure is now complete, and other conventional process steps may be performed to complete the circuit structure. The additional advantage of this embodiment is that the antifuse material layers are not exposed to wet cleaning steps.

As in the first and second embodiments of the invention disclosed herein, this etching step has the effect of reducing the area of the silicon nitride layer comprising second antifuse dielectric layer 28 and thus reduces the potential nitride charge trapping contribution to the capacitance of the antifuse, should it remain unprogrammed in the final circuit. In addition, the threshold shifting of the field transistor is eliminated, thus reducing any potential leakage currents.

As noted herein, it has been discovered that the presence of the nitride layer in the antifuse dielectric structure affects the properties of the completed antifuse relating to manufacturability and reliability. More specifically, long oxidation temperatures and times for the third dielectric layer 42 will drive more nitrogen into the $SiO_2$/Si interface, creating interface traps in the field oxide transistor and increasing transistor leakage. Using a combination of wet/dry oxidation techniques will significantly cut down the oxidation time and help to minimize this problem.

To maintain manufacturability and reliability, certain thickness ranges should be maintained for the oxide/nitride/oxide antifuse dielectric layers. It has been found that superior results may be obtained by employing either dry thermal oxidation techniques or a combination of wet and dry thermal oxidation techniques to form the upper silicon dioxide layer in the antifuse dielectric. An all dry process would be preferable, but the process window is narrow since it takes a long time to grow the silicon dioxide layer using dry technique. For example, to thermally grow 30 angstroms of oxide over the nitride layer 28, about 120 minutes will be needed if an all dry oxidation process is performed at 900° C., and about 30 minutes will be required if an all wet oxidation process is utilized at 900° C. By utilizing a combination of wet and dry oxidation techniques, , specifically, a 30 minute wet process followed by a 15 minute dry process, the resulting manufacturability will be close to that of an all dry process. A wet/dry/wet cycle may be employed and will cut the oxidation time to 60 minutes, thereby limiting the nitrogen drive in to the $SiO_2/Si$ interface. Generally, a dry oxidation step at a temperature of about 800° C. to about 950° C. for about 5 minutes to about 6 minutes, and a wet oxidation step at a temperature of about 700° C. to about 900° C. for about 5 minutes to about 60 minutes may be used.

The thermal cycle for the top oxide layer 42 may be drastically reduced by employing CVD oxidation techniques to form that layer. The temperature/time cycle for such a process is even lower than the dry/wet oxidation techniques previously mentioned, and may be as little as 10 minutes of exposure to 900° C. using state of the art processing techniques.

Finally, rapid thermal oxidation techniques may be employed to further reduce the thermal cycling during formation of oxide layer 42. The total thermal cycle effect is lower for rapid thermal oxidation compared to traditional furnace oxidation. Rapid thermal oxidation may be employed to form layer 42 at temperatures of between about 850° to 1,100° C.

According to another aspect of the present invention, the field transistor leakage problem may be reduced without the need to employ the additional mask layer 40. After the dielectric stack comprising layers 28, 30, and 42 has been formed over the field oxide layer, and after the polysilicon upper antifuse electrode 30 has been formed and defined using conventional processing steps, a wet reoxidation step at 900° C. for about 10 minutes is used instead of a dry oxidation step of 30 minutes to seal the polysilicon layer from further processing. Use of the wet step will dissociate the nitride compound into ammonia and will significantly reduce the amount of nitrogen induced traps in the field transistor regions of the integrated circuit. The wet oxidation temperature is preferably between about 700° to 950° C. for an oxidation time of between about 1 minute to 60 minutes.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A process for fabricating an antifuse comprising the following steps:

(a) forming a lower antifuse electrode;

(b) forming an insulating layer over said lower antifuse electrode;

(c) forming an antifuse aperture in said insulating layer;

(d) forming a dielectric antifuse material including a layer comprising silicon nitride over said insulating layer in the region centered over said antifuse aperture;

(e) masking said dielectric antifuse material in regions of said antifuse aperture;

(f) etching to remove substantially all of said silicon nitride layer from regions other than said antifuse aperture, said regions including regions where field transistors will be formed;

(g) forming an upper antifuse electrode over said dielectric antifuse material in said antifuse aperture after step (f) has been performed; and (h) forming a protective oxide layer over and around said upper antifuse electrode.

2. A process for fabricating an antfuse as in claim 1 wherein said antifuse material comprises a first layer of silicon dioxide and a second layer of said silicon nitride.

3. A process for fabricatinc an antifuse as in claim 2 further including the step of forming a third dielectric antifuse layer comprising silicon dioxide over said second layer comprising silicon nitride after step (f) and before step (g).

4. A process for fabricating an antifuse as in claim 3 wherein the step of forming a third dielectric antifuse layer comprises a chemical vapor deposition oxide formation sub-step.

5. A process for fabricating an antifuse as in claim 4 wherein said chemical vapor deposition oxide formation sub-step is carried out for a deposition time in the range of about 3 seconds to about 30 minutes and at a temperature in the range of about 350° C. to about 850° C.

6. A process for fabricating an antifuse as in claim 3 wherein the step of forming a third dielectric antifuse layer comprises a rapid thermal oxidation sub-step.

7. A process for fabricating an antifuse as in claim 6 wherein said rapid thermal oxidation sub-step is carried out at a temperature in the range of about 850° C. to about 1,100° C. for a time in the range of about 5 seconds to about 600 seconds.

8. A process for fabricating an antifuse as in claim 3 wherein the step of forming a third dielectric antifuse layer comprises at least one dry thermal oxidation sub-step and at least one wet thermal oxidation sub-step.

9. A process for fabricating an antifuse as in claim 8 wherein said at least one wet oxidation sub-step is performed at a temperature of about 900° C. for a time in the range of about 5 minutes to about 30 minutes.

10. A process for fabricating an anise as in claim 8 wherein said at least one dry thermal oxidation sub-step and at least one wet thermal oxidation sub-step comprise a wet oxidation sub-step followed by a dry oxidation sub-step.

11. A process for fabricating an antifuse as in claim 8 wherein said at least one dry thermal oxidation sub-step and at least one wet thermal oxidation substep comprise a dry oxidation sub-step followed by a wet oxidation sub-step.

12. A process for fabricating an antifuse as in claim 1 wherein said antifuse material comprises a first layer of silicon dioxide, a second layer of said silicon nitride and a third layer of silicon dioxide.

13. A process for fabricating an antifuse according to claim 1, wherein step (h) comprises a wet oxidation substep.

14. A process for fabricating an antifuse according to claim 13, wherein said wet oxidation sub-step of step (h) is carried out at a temperature in the range of about 700° C. to about 950° C. for a time in the range of about 1 minute to about 60 minutes.

15. A process for fabricating an antifuse according to claim 1, wherein said layer comprising silicon nitride is formed from a reacting gas including a first gas comprising $NH_3$ and a second gas selected from the group consisting of $SiH_2Cl_2$, $SiH_4$ and $SiCl_4$, wherein the ratio of said first gas to said second gas in said reacting gas is in the range of about 1 to about 20.

* * * * *